United States Patent [19]
Koen et al.

[11] Patent Number: 4,763,107
[45] Date of Patent: Aug. 9, 1988

[54] SUBRANGING ANALOG-TO-DIGITAL CONVERTER WITH MULTIPLEXED INPUT AMPLIFIER ISOLATION CIRCUIT BETWEEN SUBTRACTION NODE AND LSB ENCODER

[75] Inventors: Myron J. Koen; Thomas R. Anderson; Joel M. Halbert, all of Tucson, Ariz.

[73] Assignee: Burr-Brown Corporation, Tucson, Ariz.

[21] Appl. No.: 83,738

[22] Filed: Aug. 7, 1987

Related U.S. Application Data

[63] Continuation-in-part of Ser. No. 768,947, Aug. 23, 1985, Pat. No. 4,686,511.

[51] Int. Cl.⁴ .............................................. H03M 1/34
[52] U.S. Cl. .............................................. 340/347 AD
[58] Field of Search ................................. 340/347 AD

[56] References Cited

U.S. PATENT DOCUMENTS

| | | | |
|---|---|---|---|
| 4,251,802 | 2/1981 | Horna .................................. | 340/347 |
| 4,353,059 | 10/1982 | Vaitkus ......................... | 340/347 AD |
| 4,410,876 | 10/1983 | Sawagata ............................ | 340/347 |

OTHER PUBLICATIONS

"4-Bit Flash Chip Guarantees 100-MHz, 8-Bit System", Brian Gillings, Electronic Design, Dec. 24, 1981, vol. 29, No. 26, pp. 95-101.

*Primary Examiner*—Charles D. Miller
*Attorney, Agent, or Firm*—Cahill, Sutton & Thomas

[57] ABSTRACT

A 12 bit, 10 megahertz subranging analog-to-digital converter produces a sampled analog input signal. The sampled analog signal is converted by an MSB flash encoder to a 7 bit MSB word that is converted to an analog signal by a 7 bit DAC having 14 bit accuracy. The result is subtracted from the sample analog signal to produce a residue signal by means of a high speed amplifier having first and second multiplexed differential input stages, the first input stage having differential inputs receiving the sampled analog input signal and the analog signal produced by the 7 bit DAC. The second differential input stage has one input connected to ground and the other input resistively coupled to the output of the high speed amplifier. The output of the high speed amplifier is resistively coupled to the second input of the first and second differential stages. The multiplexed input high speed amplifier produces an intermediate input level until the output of the DAC is stable. Amplifying of the residue signal then begins from a balanced amplifier condition, and avoids delays that might result from an initial overdriven amplifier condition.

6 Claims, 4 Drawing Sheets

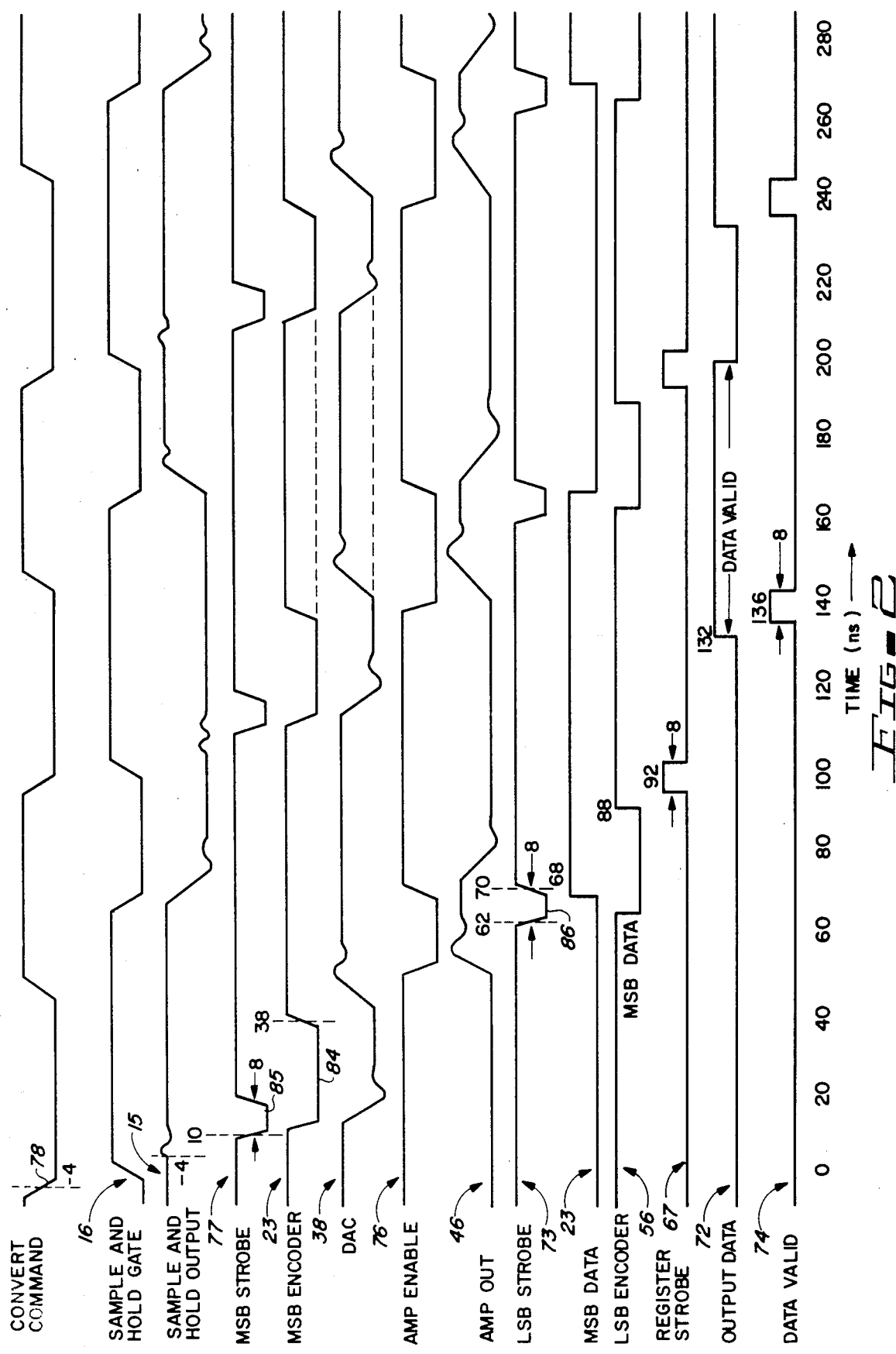

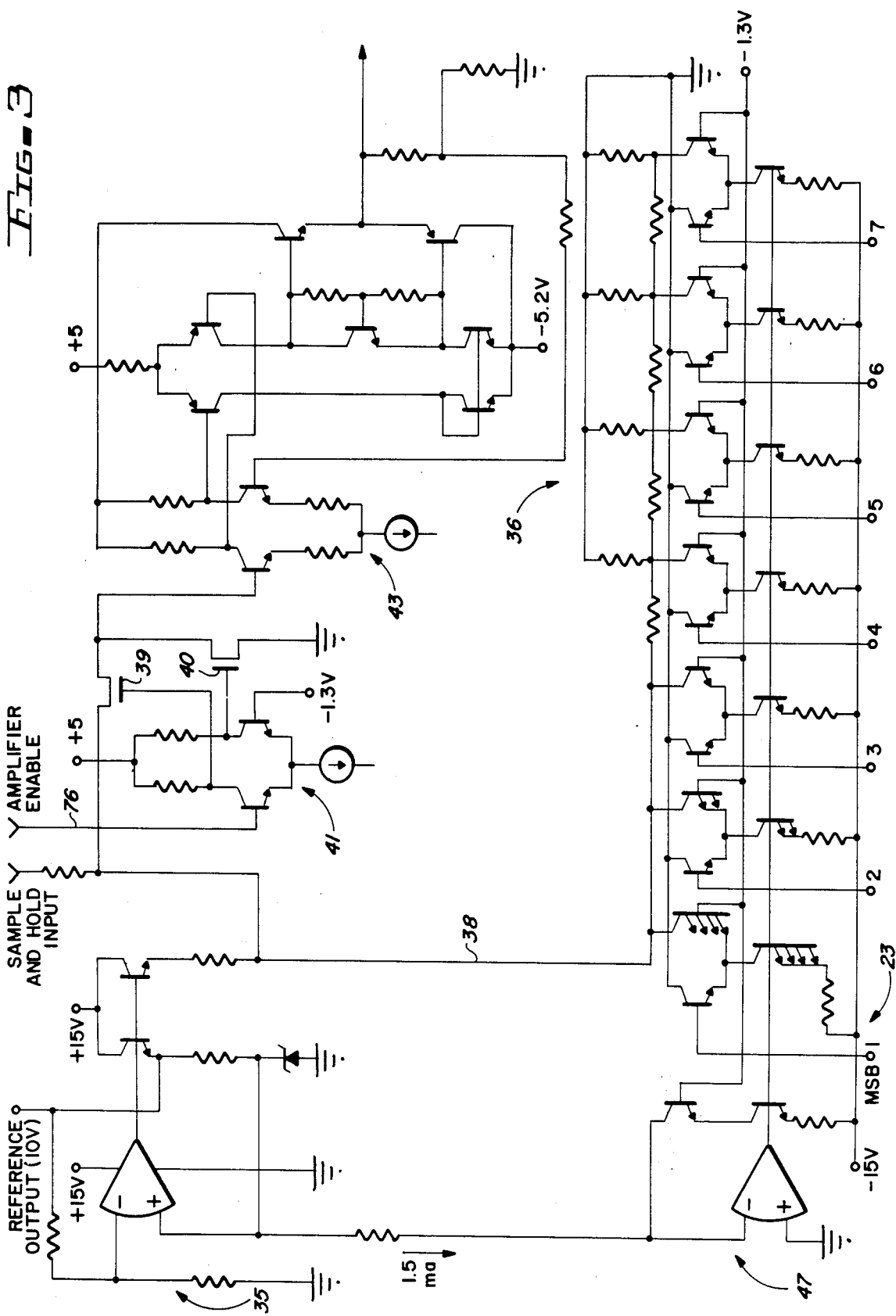

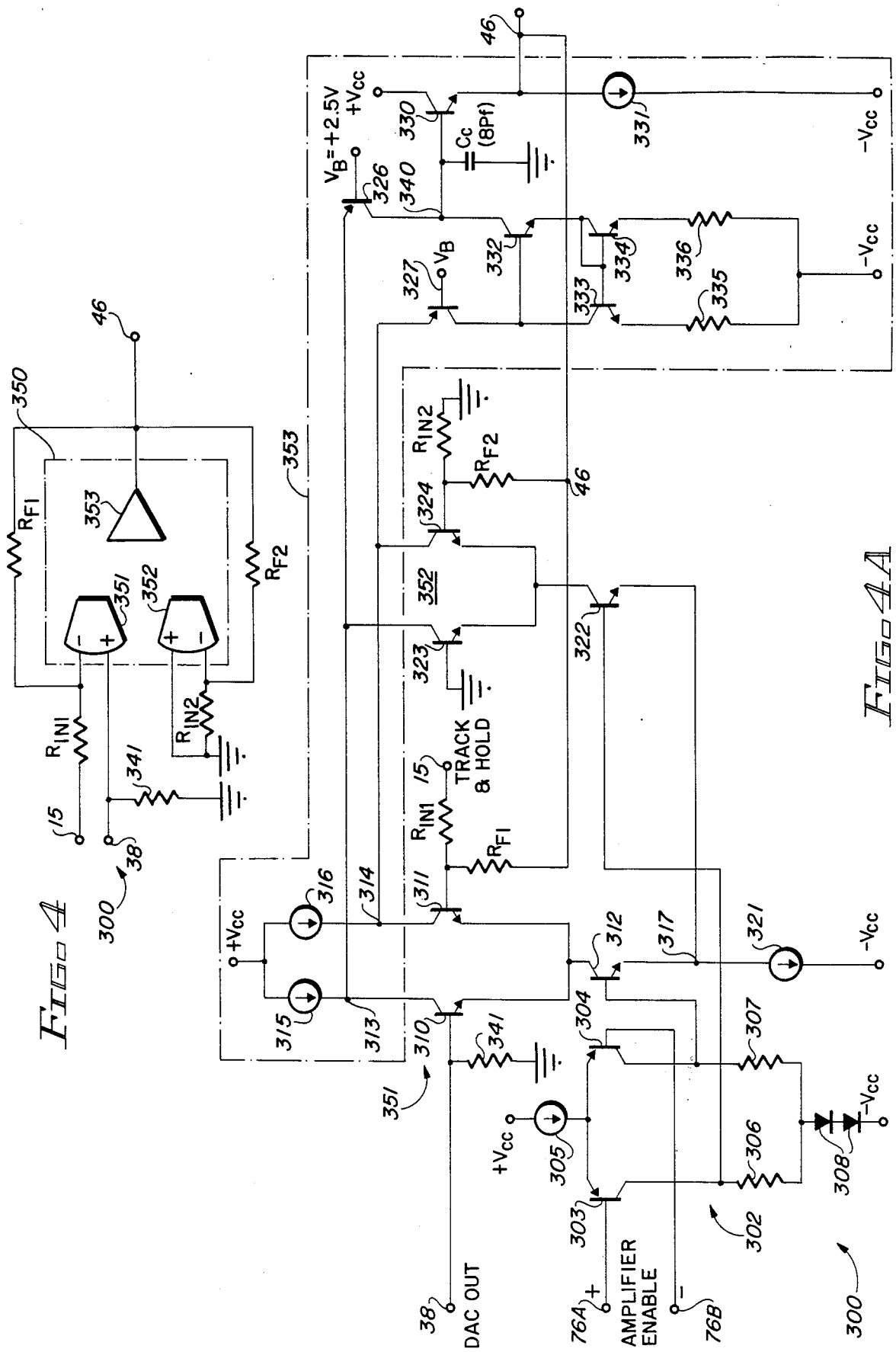

SUBRANGING ANALOG-TO-DIGITAL CONVERTER WITH MULTIPLEXED INPUT AMPLIFIER ISOLATION CIRCUIT BETWEEN SUBTRACTION NODE AND LSB ENCODER

CROSS-REFERENCE TO RELATED APPLICATION

This application is a continuation-in-part of allowed patent application "SUBRANGING ANALOG-TO-DIGITAL CONVERTER WITH FET ISOLATION CIRCUIT BETWEEN SUBTRACTION NODE AND LSB ENCODER", Ser. No. 768,947, filed Aug. 23, 1985, which will issue as U.S. Pat. No. 4,686,511 on Aug. 11, 1987, assigned to the present assignee and incorporated herein by reference.

BACKGROUND OF THE INVENTION

The invention relates to a high speed, high accuracy subranging analog-to-digital converter, and particularly to techniques for improving the accuracy of the residue signals and preventing overdriving of a residue signal amplifier.

A type of analog-to-digital converter (ADC) known as a subranging ADC is one of three common types of high speed ADCs. ADCs of the successive approximation type are simple in structure, and may be very accurate, but they have very slow conversion times, due to the serial nature of the conversion processes therein. For example, for a successive approximation analog-to-digital converter with 12 bits of resolution, conversion times of about 0.6 microseconds to one microsecond are typical. At the other extreme, ADCs of the "flash converter" type have very short conversion times, requiring on cycle of operation. However, the high speed is achieved at the expense of greatly increased circuit complexity. Flash converters with 8 bits of resolution and conversion rates as high as 100 megahertz represent the limit of present integrated circuit technology. ADCs of the subranging type provide an intermediate compromise between flash encoders and successive approximation ADCs. The present state-of-the-art for subranging ADCs is thought to be represented by a 12 bit, 10 megahertz subranging analog-to-digital converter Model No. CAV-1210, manufactured by Analog Devices Corporation. Subranging analog-to-digital converters typically use a sample and hold or track and hold circuit that produces a sample voltage which is encoded by a MSB (most significant bit) flash encoder to produce an MSB word. The MSB word is temporarily stored in a register. The sampled analog input is also fed forward through a delay circuit to a summing node (that can also be referred to as a subtraction node). The MSB word then is input to a high accuracy digital-to-analog converter to produce a highly accurate analog representation of the MSB word, which then is subtracted from the fed forward analog input to produce a residue signal. The residue signal is amplified and applied to an LSB (least significant bit) flash encoder. The LSB word and the MSB word are combined by digital error correcting circuitry to produce the desired digital output word.

The most advanced presently available subranging ADCs suffer from a number of shortcomings. They are very expensive, typically costing about $2,500.00 for a 12 bit, 10 megahertz device. They typically are very large, requiring a 35 square inch printed circuit board. Their accuracy is likely to be less than their 12 bit resolution, and their reliability at speeds approaching the limit of their 10 megahertz specifications may be undesirably low. A relatively large number of external potentiometers, which must individually be adjusted to obtain reasonably accurate conversion, add to the cost and inconvenience of presently available subranging ADCs. Adjustments of the external potentiometers at one temperature to achieve satisfactory operation at one temperature may not result in satisfactory operation at other temperatures.

Thus, it is clear that there is an unmet need for a very substantial improvement in the state-of-the-art of subranging analog-to-digital converters. However, the way to achieve such improvement has not been clear. There are many refinements that could enter into the overall performance of a subranging analog-to-digital converter, including refinements in the sample and hold or track and hold circuitry, improvements in the flash encoders used, different combinations of "widths" for the outputs of the MSB flash encoders and the LSb flash encoders, refinements for preventing overdriving of the residue amplifiers, and providing of different techniques and improvements in the digital error correcting circuitry for reconstructing the MSB word and the LSB word to produce an accurate digital output word of the desired resolution and accuracy.

The sample and hold circuits required in subranging analog-to-digital converters must be very accurate. Typically, such sample and hold (or track and hold) circuits include a switching diode sampling bridge that is isolated from the analog input signal by a high speed, highly accurate open loop input buffer. A sampling capacitor is connected to the output of the diode sampling bridge, which is actuated in response to a "sample command", and is applied as an input to a second high speed buffer. Typically, the output impedance of a sample and hold circuit of the type used in subranging analog-to-digital converters, such as the HTS0010 track and hold circuit made by Analog Devices Corporation, is about 5 ohms. The gain of the track and hold circuit is adjusted by an external potentiometer.

SUMMARY OF THE INVENTION

Accordingly, it is an object of the invention to provide an improved high speed, high accuracy subranging analog-to-digital converter.

It is another object of the invention to reduce the cost and complexity of a residue amplifier circuitry having enable and disable functions in a subranging analog-to-digital converter.

It is another object of the invention to provide an improved technique for avoiding overdriving of the residue amplifier of a high speed, high accuracy subranging analog-to-digital converter and thereby avoiding delays associated with the residue amplifier recovery from an overdriven condition.

Briefly described, and in accordance with one embodiment thereof, the invention provides a high speed, high resolution, high accuracy subranging analog-to-digital converter including a most significant bit (MSB) flash encoder or analog-to-digital converter, the outputs of which are coupled to the inputs of a digital-to-analog converter having higher accuracy than the resolution of the digital word into which the analog input is to be converted, a residue amplifier having first and second multiplexed differential input stages, responsive to an amplifier enable control signals the first multiplexed differential input stage receiving the analog input of the MSB flash encoder and the output of the digital-to-analog converter, the inputs of the second multiplexed differential input stage being coupled to ground and the output of the residue amplifier, and a least significant bit (LSB) flash encoder or analog-to-digital converter. In the described embodiment of the invention, the MSB flash encoder and the LSB flash encoder each produce 7 bit outputs that are latched into a digital error correction circuit. The least significant 7 bits and the most significant 7 bits produced by the LSB flash encoder and the MSB flash encoder, respectively, are added together to produce a 12 bit output word representing the analog input to the subranging analog-to-digital converter. The multiplexed differential input stages prevent overdriving of the residue amplifier, and allow direct feed forward of the analog input voltage, thereby avoiding inaccuracies associated with feed forward delay circuity of prior subranging analog-to-digital converters and are much more readily implemented on a monolithic circuit chip than the field effect transistor residue amplifier switching circuitry described in FIG. 1 and claimed in parent application Ser. No. 768,947.

BRIEF DESCRIPTION OF THE DRAWINGS

FIG. 2 is a diagram illustrating the various waveforms that occur during operation of the circuit of FIG. 1.

FIG. 3 is a circuit schematic diagram of a portion of the subranging analog-to-digital converter of FIG. 1.

FIG. 4 is a schematic block diagram of a multiplexed input differential amplifier that can be utilized in lieu of the circuitry enclosed by dotted line 300 in FIG. 1.

FIG. 4A is a detailed circuit schematic diagram of the circuitry shown in FIG. 4.

DESCRIPTION OF THE INVENTION

Figure 1:
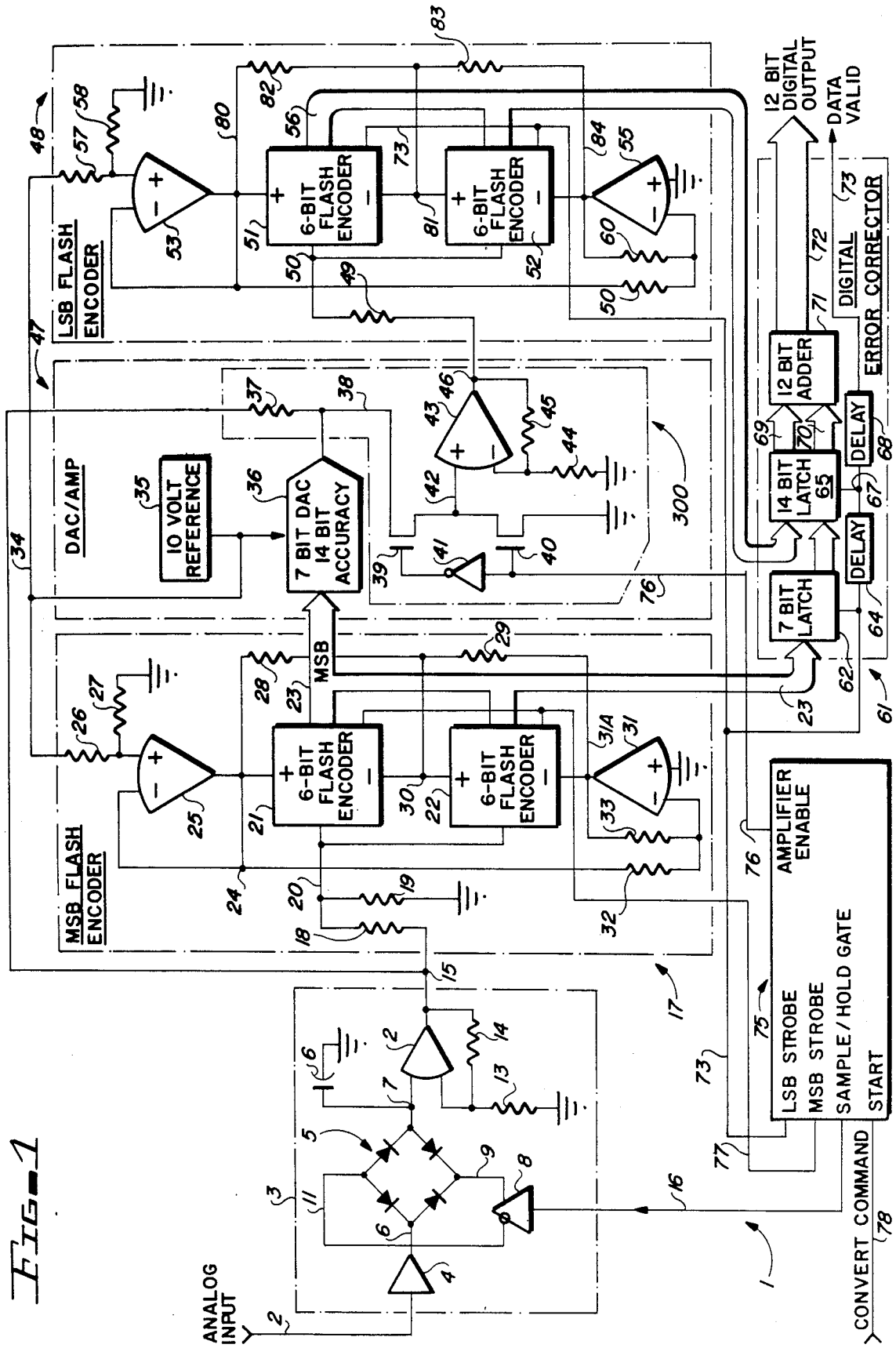
FIG. 1 is a block diagram of the subranging analog-to-digital converter of the present invention.

Referring to FIG. 1, reference numeral 1 designates a subranging "modular" 12 bit analog-to-digital converter (ADC) that is capable of very accurate operation at a 10 megahertz rate. 12 bit ADC 1 includes a sample and hold circuit 3, which samples an analog input signal 2 and precisely applies the sampled analog input to produce a stable "sampled" output voltage on conductor 15. That sampled output voltage is applied to the analog input of a 7 bit flash encoder (i.e., a 7 bit analog-to-digital converter) 17.

Flash encoder 17 is hereinafter referred to as "MSB flash encoder" 17. It produces a 7 bit digital output, in response to an MSB strobe signal produced on conductor 77 by a timing circuit 75. The 7 bit digital output of MSB flash encoder 17 is applied to a 7 bit digital-to-analog converter (DAC) 36 having 14 bit accuracy.

The highly accurate analog signal produced on node 38 by DAC 36 is subtracted from the sampled voltage produced on conductor 15, and the result is amplified by a wide band operational amplifier 43 to produce an analog signal 46 that is applied to the analog input of a second flash encoder 48, hereinafter referred to as LSB flash encoder 48.

The 7 bit output produced by MSB flash encoder 17 and the 7 bit output produced by LSb flash encoder 48 are applied to appropriate inputs of a digital error correcting circuit 61, which combines the two 7 bit outputs to produce a 12 bit digital output 72 that precisely represents the value of the sampled analog input signal.

Sample and hold circuit 3 includes an input buffer 4, the output of which is applied to a conventional diode bridge switching circuit 5. Input buffer 4 can be any suitable high speed open loop buffer circuit, such as a HA-5033, by Harris Semiconductor, Inc. Diode bridge switching circuit 5 couples four hot carrier diodes 5A, 5B, 5C, and 5D (see FIG. 4) between conductors 6, 9, 7, and 11 in the manner shown. A sample and hold gate strobe signal is applied by means of conductor 16 to the input of an inverter/buffer circuit 8, the inverting and non-inverting outputs of which are connected to conductors 9 and 11, respectively.

Output node 7 of diode bridge switching circuit 5 is connected to one terminal of a 40 picofarad sampling capacitor 6, the other terminal of which is connected to ground. Conductor 7 of switching diode bridge circuit 5 is connected to the non-inverting input of a very accurate, high gain, high bandwidth operational amplifier 2, the output of which is connected to conductor 15. Conductor 15 is coupled by feedback resistor 14 to the inverting input of operational amplifier 2. That inverting input also is connected by resistor 13 to ground.

Sample and hold circuit 3 includes the combination of a closed loop amplifier 2 with the conventional diode switching bridge structure 5. Ordinarily, open loop buffers, rather than closed loop operational amplifiers, are provided to buffer the sampling capacitor from the output of a sample and hold circuit, if very precise sampling of an analog input is required. This is because no sufficiently accurate, stable, high speed, high bandwidth, high input impedance operational amplifier has been heretofore available.

MSB flash encoder 17 includes two 6 bit flash encoder circuits 21 and 22, each of which can be a Siemens SDA5200 flash encoder. Analog inputs of each of 6 bit flash encoders 21 are connected by conductor 20 to 100 ohm resistors 18 and 19. The opposite terminal of resistor 19 is connected to ground, and the opposite terminal of resistor 18 is connected to conductor 15.

The positive reference input of 6 bit flash encoder 21 is connected by conductor 24 to the output of an ordinary operational amplifier 25. The positive input of operational amplifier 25 is connected to one terminal of each of resistors 26 and 27. The opposite terminal of resistor 27 is connected to ground. The opposite terminal of resistor 26 is connected to a 10 volt reference voltage on conductor 34, produced by a 10 volt reference circuit 35. The negative input of operational amplifier 25 is connected to conductor 24. The negative reference input of 6 bit flash encoder circuit 21 is connected by conductor 30 to the positive reference voltage input of 6 bit flash encoder 22. The negative reference input of 6 bit flash encoder 22 is connected by conductor 31A to the output of an ordinary operational amplifier 31, the positive input of which is connected to ground. The negative input of operational amplifier 31 is connected by resistor 33 to output conductor 31A. Operational amplifier 25 reduces the 10 volt reference voltage produced on conductor 34 by 10 volt reference circuit 35 to about +0.625 volts, which is applied to the positive reference input of 6 bit flash encoder 21. Operational amplifier 31 inverts this +0.625 volt reference voltage to produce reference voltage of about −0.625 volts that is applied to the negative reference input of 6 bit flash encoder 22. The negative input of operational amplifier 31 also is connected by resistor 32 to conductor 24.

An error adjustment resistor 28 is connected between conductor 24 and conductor 30. A second error adjustment resistor 29 is connected between conductors 30 and 31A. The purpose of the error adjustment resistors 28 and 29, in combination with resistors 26, 27, 32, and 33, is to superimpose a positive error signal on the output reference voltage levels produced by operational amplifiers 25 and 31 and on conductor 30 in order to avoid the need for digital error correcting circuit 75 to process negative digital numbers. This matter will be described subsequently in more detail.

The output of 7 bit DAC 36, the circuitry of which is shown in FIG. 3, is connected by subtraction node 38 and 200 ohm resistor 37 to sample and hold output conductor 15. Subtraction node 38 is also connected to the drain of MOS field effect transistor (MOSFET) 39. The gate of MOSFET 39 is connected to the output of inverting buffer 41, the input of which is connected to the gate of MOS field effect transistor 40. The source of MOSFET 40 is connected to ground. The drain of MOSFET 40 is connected to the source of MOSFET 39 and to conductor 42. Conductor 42 is connected to the positive input of wide band operational amplifier 43, the output of which is connected to conductor 46. The negative input of operational amplifier 43 is connected by feedback resistor 45 to conductor 46 and is also connected by resistor 44 to ground. Amplifier 43 produces a gain of 32.

The input of inverting buffer 41 is connected to Amplifier Enable signal 76, which is produced by timing circuit 75. Amplifier Enable signal 76 is shown by waveform 76 in FIG. 2. The Sample and Hold Strobe signal produced on conductor 16 is shown by waveform 16 in FIG. 2. The MSB Strobe signal applied to the strobe inputs of 6 bit flash encoders 21 and 22, produced on conductor 77 by timing circuit 75 in response to convert command 78, is shown by waveform 77 in FIG. 2. The output of a typical one of the seven conductors 23 produced by MSB flash encoder 17 is shown by the MSB Data waveform 23 in FIG. 2.

The amplified output signal 46 produced by operational amplifier 43 is applied to the analog inputs of 6 bit flash encoders 51 and 52 of LSB flash encoder 48, by means of resistor 49 and conductor 50. 6 bit flash encoders 51 and 52 are identical to previously described 6 bit flash encoders 21 and 22, and are connected in precisely the same manner. Similarly, operational amplifiers 53 and 55 produce approximately +0.625 volt and approximately −0.625 volt reference voltages at the positive reference input of 6 bit flash encoder 51 and the negative reference input of flash encoder 52, essentially as in MSB flash encoder 17. The negative reference input of flash encoder 52 is connected by conductor 81 to the positive reference input of flash encoder 52. Error adjustment resistor 82 is connected between output conductor 80 of operational amplifier 53 and conductor 81. Error adjustment resistor 83 is connected between conductor 81 and the output of operational amplifier 55. Adjustment resistors 82 and 83 and resistors 57, 58, 59, and 60 are adjusted in order to precisely adjust the voltages on conductors 80, 81, and 84 so as to produce all "ones" at the 7 bit output 56, when +0.625 volts is applied to conductor 50, all zeroes when −0.625 volts is applied to conductor 50, and a suitable intermediate voltage, with one bit being a "one" and the rest being "zeros" when 0 volts is applied to conductor 50.

The LSB strobe signal produced on conductor 73 by timing circuit 75 in response to convert command 78 is applied to the strobe inputs of flash encoder circuits 51 and 52. The LSB Data signal 56 in FIG. 2 shows a typical waveform on one of the conductors of LSB bus 56 generated at the output of LSB flash encoder 48 in response to the LSB Strobe signal on conductor 73.

In FIG. 1, digital error correcting circuit 61 includes a 7 bit latch 62, the inputs of which are connected to the seven respective MSB conductors 23. The outputs of 7 bit latch circuit 62 are connected by seven conductors 63 to the 7 most significant bits of a 14 bit latch 65. Conductors 56, connected to the outputs of LSB flash encoder 48, are connected to the 7 least most significant bits of 14 bit latch 65. The corresponding 7 least significant output bits 69 of 14 bit latch 65 are connected to the 7 least significant bit inputs of a 12 bit binary adder. The 7 most significant bits 70 of 14 bit latch 65 are connected, respectively, to one input of each of the 7 most significant bit pairs of inputs of 12 bit adder 71. The 2 most significant bits of bus 69 and the 2 least significant bits of bus 70 thus "overlap", i.e., are connected to inputs of the same two bits (i.e., bits 6 and 7) of 12 bit adder circuit 71.

The LSB Strobe signal on conductor 73 is delayed 30 nanoseconds by delay element 64, to produce a delayed Register Strobe signal on conductor 67, which is applied to the strobe input of 14 bit latch 65. The Register Strobe signal on conductor 67 is further delayed 44 nanoseconds by delay circuit 68 to produce the Data Valid signal on conductor 74, shown by waveform 74 in FIG. 2. The Register Strobe signal is shown by waveform 67 in FIG. 2, and is used for the purpose of storing data in the 14 bit latch 65. The data produced on a typical conductor of 12 bit digital output bus 72 is designated by Output Data waveform 72 in FIG. 2. The Amplifier Enable 76 produced in response to Convert Command 78 is indicated by waveform 76 of FIG. 2.

Briefly, the Convert Command 78 causes the timing circuit 75 to produce the Sample and Hold Strobe pulse 16, as indicated by waveforms 78 and 16 in FIG. 2. The value of the analog input voltage 2 to be converted is very precisely held on conductor 15, as shown by Sample and Hold Output waveform 15 in FIG. 2. After a delay of about 38 nanoseconds, pulses such as 84 of waveform 23 are produced on various conductors of MSB bus 23 by the MSB flash encoder 17. The 7 bits 23 produced by 7 bit MSB flash encoder 17 eventually are used in producing the 7 most significant bits of the 12 bit binary output produced on output bus 72. Simultaneously, the sampled analog signal level on conductor 15 is fed forward through 200 ohm resistor 37 to subtraction node 38. The 7 MSB word bits 23 are temporarily loaded into 7 bit latch 62 of digital error correcting circuit 61, and also are applied to the inputs of 7 bit DAC 36, which, as previously mentioned, has 14 bit accuracy. 7 bit DAC 36 is quite similar to a Burr-Brown Model DAC63; its configuration is shown in detail in FIG. 3, subsequently described. The analog output of 7 bit DAC 36 is shown by the DAC waveform 38 in FIG. 2.

It can be seen that two analog signals including the output waveform 38 of 7 bit DAC 36, which is an analog signal that very accurately represents the 7 bits output of the MSB flash encoder 17, and an extremely precise replica of the original sampled voltage on conductor 15, are applied to subtraction node 38. Usually, there will be a voltage difference between these two signals. This voltage difference is referred to as the difference signal or "residue".

In accordance with the present invention, the residue or difference signal is very accurate, because DAC 36 has 14 bit accuracy, and the sampled voltage 15 fed forward to subtraction conductor 38 is very accurate. Thus, it can be seen that the residue is a very accurate, low amplitude, analog representation of the 5 least significant bits of the desired 12 bit digital output representation of the original analog input signal 2.

N-channel MOSFETs 39 and 40 isolate the input of wide band amplifier 43 from subtraction node 38 by turning MOSFET 39 off and turning MOSFET 40 on, and thereby connecting the positive input of amplifier 43 to ground, until the above-mentioned conversion by 7 bit DAC 36 is complete. This prevents any difference produced on subtraction node 38 during the sample and hold process from overdriving, and possibly saturating, wide band operational amplifier 43.

It is highly desirable to avoid saturating wide band operational amplifier 43. This is true because the overload recovery time of operational amplifier 43 would have to be included in the overall analog-to-digital conversion time of ADC 1.

Further in accordance with the present invention, the elimination of the feed forward delay circuitry used in the prior art Model CAV-1210 A/D converter produced by Analog Devices Corporation provides the benefit of greatly increasing the accuracy and overall reliability of the 12 bit, 10 megahertz analog-to-digital converter of the present invention, and greatly reduces the cost thereof, by (1) preventing any distortion in the value of the sampled analog voltage on conductor 15, when the sampled analog voltage is transmitted forward to subtraction node 38, and (2) avoiding the high cost of the feed forward delay circuitry thereon. As previously mentioned, most prior subranging high speed, high accuracy analog-to-digital converters utilize a feed forward delay line between the sample and hold circuit output and the subtraction node to avoid overdriving the residue amplifier circuit.

The Amplifier Enable signal 76 turns on MOSFET 39 and turns off MOSFET 40 after 7 bit DAC 36 has completed its conversion, thereby applying the residue signal to the non-inverting input of wide band amplifier 43. Wide band amplifier 43 then amplifies the residue or difference signal by a gain factor of 16. The resulting output signal 46 is shown by waveform 46 in FIG. 2. The Amplifier Enable signal 76 is represented by waveform 76 in FIG. 2.

After 30 nanoseconds has been allowed for the settling of the wide band amplifier output signal 46, the LSB strobe signal 73 is produced by timing circuit 75, causing LSB flash encoder 48 to convert the very accurate amplified residue signal into a 7 bit LSB word on bus 56. This 7 bit LSB word is loaded into the least significant 7 bits of 14 bit latch circuit 65. The 7 bit MSB word stored in latch 62 also is loaded into the 7 most significant bits of 14 bit latch 65.

12 bit adder 71 then simply adds the thus "overlapped" 7 bit MSB word and the 7 bit LSB word together to produce an accurate 12 bit output word on bus 72.

Resistors 26, 27, 28, 29, 32, and 33 are adjusted to add +39 millivolts t the outputs of operational amplifiers 25 and 31 of MSB flash encoder 17. Otherwise, the above mentioned +0.625 volts would be applied to the positive reference input of flash encoder 21 and −0.625 millivolts would be applied to the negative reference input of flash encoder 22. This error voltage addition is performed, by laser trimming the foregoing resistors 28 and 29, to ensure that any error introduced by MSB flash encoder 17 falls in a positive, rather than a negative, voltage range, so that the positive error can be cancelled out by an adding operation, which is performed by 12 bit adder 71. Resistors 26 and 27 are laser trimmed to produce a voltage equal to the sum of +0.625 volts and +0.039 volts to the positive reference voltage input of 6 bit flash encoder 21. Resistors 32 and 33 are laser trimmed to cause operational amplifier 31 to produce a voltage equal to the sum of −0.625 volts and +0.039 volts at the negative reference voltage input of 6 bit flash encoder 27. Resistors 28 and 29 are laser trimmed to produce the voltage needed on conductor 30 so that the digital outputs of 6 bit flash encoder 21 and 6 bit flash encoder 22 produce the proper digital outputs, including a +0.039 volt error, when +0.625 volts, −0.625 volts, and 0 volts are applied to the input 20 thereof.

Resistors 57, 58, 59, 60, 82, and 83 of LSB flash encoder 48 are adjusted so that correct digital outputs of LSB flash encoder are obtained when +0.625 volts, 0 volts, and −0.625 volts are applied to the conductor 46. This results in operational amplifier 53 applying about +0.625 volts to the positive reference input of flash encoder 51 and operational amplifier 55 applying about −0.625 volts to the minus reference input of flash encoder 52. The reason for these adjustments will be explained later.

Now that the basic structure shown in FIG. 1 has been explained, and the most significant waveforms occurring therein have been shown in FIG. 2, the overall operation of analog-to-digital converter 1 will be described. The analog input signal 2 is initially provided as an input to sample and hold circuit 3, which produces the sampled signal on conductor 15 within 33 nanoseconds. Use of the sample and hold circuit, rather than applying the analog input directly to conductor 15, reduces the aperture jitter of the ADC 1 to about 25 picoseconds. The diode bridge switching circuit 5 is used to implement the needed sampling switch because it appears to offer the best solution to the conflicting requirements of extremely high accuracy and extremely high speed required to achieve the 10 megahertz conversion rate of ADC 1. By providing the previously described extremely high accuracy, high speed highly stable operational amplifier 3, trimming of resistors 13 and 14 to provide a gain of exactly 1, a very low output impedance of about 0.25 ohms is accomplished for operational amplifier 2, enabling it to drive the feed forward 200 ohm resistor 37 and the MSB flash encoder input resistor network 18, 19 with a low combined resistance of about 100 ohms, with negligible inaccuracy due to the loading on operational amplifier 2.

Due to the fact that the sampling capacitor 6 is not in the amplifier feedback path, the closed loop output amplifier 2 need settle only to within 7 bit accuracy before the MSB flash encoder is strobed. As long as the closed loop output amplifier 2 settles to within 12 bit accuracy by the time the LSB flash encoder 48 is strobed, the digital correction circuitry 61 is capable of correcting the extended settling error. Therefore, an additional 60 nanoseconds can be tolerated to allow the closed loop amplifier 2 to settle within 12 bit accuracy. In a similar fashion, affects of current leakage of sampling capacitor 6 will create only offset error that is correctable by the digital error correction circuitry 61, but will not introduce a linearity error.

After the initial "acquisition time" or analog input sampling time of 33 nanoseconds has elapsed, an additional 18 nanoseconds is allowed to elapse before the MSB flash encoder 17 is strobed by MSB Strobe signal 77. MSB flash encoder 17 establishes the 7 most significant bits to the input of the 12 bit adder 71; in other words, the MSB flash encoder 17 determines the initial "coarse" approximation of the input signal. The described two 6 bit flash encoders 21 and 22 were utilized to provide the needed resolution, accuracy and range to accomplish satisfactory "assembly" of the final 12 bit digital output word.

As previously described, the initial "coarse" approximation to the sampled analog input signal 15 is converted back to a very accurate analog signal that is subtracted from the fed forward sampled digital analog input signal. As shown in FIG. 3, the 7 bit DAC is ECL (emitter coupled logic) compatible and achieves 14 bit accuracy, with a settling time of 25 nanoseconds. The switching of the MOSFET gating switch circuitry 39, 40 in response to the Amplifier Enable signal 76 is to prevent the wide band amplifier 43 from overloading during the time when the sample and hold circuit 3 is processing a new analog signal and the MSB flash encoder 17 is still holding data from the previous sample. In accordance with the present invention, isolation of the input of wide band amplifier 43 from the subtraction node 38 until (1) the conversion by DAC 36 is complete, and (2) the data acquisition by sample and hold circuit 3 is complete, provides two substantial advantages. The first advantage is that the sampled voltage on conductor 15 is fed forward directly, with no distortion or delay, to subtraction node 38, and therefore is as precisely accurate as the sampled analog signal 15 itself. The second advantage is that only the residue voltage is ever applied to the input of wide band amplifier 43, so that wide band amplifier 43 never gets overdriven, and consequently, never saturates. This avoids the need to add additional settling time to the conversion process that would otherwise be required to allow wide band amplifier 43 to recover from a worst case overdriven condition.

The residue signal, after being multiplied by a gain of 16 by wide band amplifier 43, is applied to the analog input of LSb flash encoder 48, which is identical to MSB encoder 17, in order to improve the manufacturability of the device, except that the resistive input network 18, 19 of MSB flash encoder 17 is not used for the LSB encoder. This is done so that the same reference voltage can be used without having to double the gain of amplifier 43. Operating amplifier 43 at the lower gain that then is permissible allows amplifier 43 to have greater bandwidth, and hence allows it to have a low settling time of 25 nanoseconds. This is important in achieving the low overall conversion time of ADC 1. After the data in each of the MSB and LSB encoders has been latched into the 14 bit latch 65 of the digital error correcting circuit 61, the two 7 bit MSB and LSB words, with the 2 middle bits of each "overlapping", assembles the final 12 bit word.

The timing circuit 75 provides the timing signals in accordance with the waveforms shown in FIG. 2. More specifically, the conversion process is initiated by bringing the Convert Command 78 to a high level. At the same time, the Sample/Hold Strobe signal 16 is brought to a high level to place sample and hold circuit 3 in a "hold" mode. After a delay of 18 nanoseconds, to allow settling of the sample and hold circuit, an 8 nanosecond pulse 85 of MSB strobe pulse 77 is produced to strobe the sampled voltage 15 into the MSB flash encoder 17.

A delay of 22 nanoseconds is allowed for the latched data to become available to drive 7 bit DAC 36. At about the same time that the new digital data is presented to the inputs of DAC 36, Amplifier Enable signal 76 permits the wide band amplifier 43 to be switched into its active mode. When the output of amplifier 43 has settled, another 8 nanosecond strobe pulse 86 is generated on conductor 73 to latch the output of the LSB flash encoder 48 and to transfer the LSB word on conductor 56 into 14 bit latch 65. As soon as both the MSB data 23 and the LSB data 56 are stored in digital form in 14 bit latch 65, the sample and hold circuit 3 is placed back in the sample mode. The pulse on conductor 67 is derived from the LSB encoder strobe pulse 73 and delayed 30 nanoseconds to load 14 bit latch 65. The final Data Valid pulse 74 then is generated to indicate that the data on bus 72, constituting the 12 bit digital output word is representative of the sampled analog input signal, is stable.

As previously mentioned, resistors 26, 27, 28, 29, 32, and 33 are laser trimmed during the manufacturing operation to add 39 millivolts to the outputs of each of operational amplifiers 25 and 31 and to conductor 30. The 39 millivolt amount is selected on the basis of the determination of the maximum possible positive error likely to be produced in the MSB flash encoder 17, and a determination of the maximum negative error likely to be produced by MSB flash encoder 17; the two are added together. Addition of this total error voltage to both of the positive and negative reference inputs of MSB flash encoder 17 forces any error that is likely to be introduced by MSB flash encoder 17 to be in a positive error voltage range which will be represented by a positive digital quantity, which then can be corrected by digital error correction circuitry 61 without its having to process negative digital numbers, which would add considerably to the complexity of digital error correcting circuitry 61.

The problem in dealing with digital error correcting of errors that might fall in either a positive or negative voltage range is a problem generally faced in the design of subranging analog-to-digital converters. To my knowledge, the problem has not been solved in the manner that I have proposed above.

My analysis of the subranging ADC 1 of FIG. 1 shows that the digital output word 72 contains only two error terms, namely, the error introduced by digital-to-analog converter 36, and the error introduced by LSB encoder 48. Errors introduced in MSB flash encoder 17 do not appear in the final output, nor do small sampling errors or errors due to leakage of the sampling capacitor 6, as long as the closed loop amplifier of the sample and hold circuit settles within 12 bit accuracy by the time that the LSB Strobe Pulse is produced on conductor 73. This is deemed to be a surprising result, that led to simplification of the digital error correcting circuitry by deliberate introduction of error into the MSB flash encoder 17, which, in turn, simplifies the digital error correcting circuitry without adding any inaccuracy at all to the final 12 bit digital word produced by the ADC 1.

As mentioned above, 7 bit DAC 7 has 14 bit accuracy. Ordinarily, most commercially available DACs have approximately the same accuracy as resolution. However, those used in subranging analog-to-digital converters need much higher accuracy than resolution. A commercially available DAC that would be suitable is the above-mentioned Burr-Brown Corporation DAC63. 7 bit DAC 36, as used in the presently preferred embodiment of the invention, is somewhat different than the Burr-Brown DAC63 and therefore is shown in relevant detail in FIG. 3, for the purpose of completing the disclosure and enabling those skilled in the art to practice the invention without undue experimentation. In FIG. 3, the DAC/amplifier module designated by reference numeral 47 includes the 10 volt reference voltage circuit 35, which includes an operational amplifier, a zener diode, and a pair of emitter follower outputs, one of which supplies a 1.5 milliampere reference current to a control amplifier 88 of 7 bit DAC 36. The amplifier enable inverter is an emitter coupled logic stage having on input connected to Amplifier Enable conductor 76 and a −1.3 volt reference voltage applied to the other input. The two inverting and non-inverting outputs are connected to the gate electrodes of MOSFETs 39 and 40, respectively.

The above-described circuitry including inverter 41, MOSFETs 39 and 40, and wide band amplifier 43 encompassed within dotted lines 30 in FIG. 1 can be replaced by a multiplexed differential input amplifier similar to the type marketed by the assignee as a SWOP amp (switchable input operational amplifier), with feedback resistors. Referring to FIG. 4, reference numeral 350 designates a SWOP amp, which includes a first and second selectable differential input stages 351 and 352 and an output stage 353 which is selectively coupled to one or the other of input stages 351 and 352. An output node of output stage 353 is connected to conductor 46. The inverting input of differential input stage 351 is connected by feedback resistor $R_{F1}$ to output conductor 46 and by resistor $R_{IN1}$ to sample and hold output conductor 15. The non-inverting input of differential input stage 351 is connected by resistor 341 to both ground and digital-to-analog converter output conductor 38. The non-inverting input of differential input stage 352 is connected to ground. The inverting input of differential input stage 352 is connected by resistor $R_{IN2}$ to ground and by feedback resistor $R_{F2}$ to output conductor 46. The summing resistor 37 of FIG. 1 thus is omitted, so that the voltage difference between track and hold output conductor 15 and DAC output conductor 38 no longer is developed across a resistor, but instead is supplied to the differential inputs of selectable input stage 351 of SWOP amp 350.

Although SWOP amp 350 could be implemented by one skilled in the art (see the article "Multiplexed Inputs on Op Amp Simplify a Variety of Circuits", EDN, Jan. 12, 1984, pp. 257–264 by co-inventor Anderson), a detailed circuit schematic for the circuit precisely as implemented in the present embodiment of the invention is shown in FIG. 4A. Also see commonly assigned U.S. Pat. No. 4,591,740 issued May 27, 1986, and entitled "MULTIPLE INPUT PORT CIRCUIT HAVING TEMPERATURE ZERO VOLTAGE OFFSET BIAS MEANS". The most significant resistor values shown in the circuit of FIG. 4A are indicated in the following table.

TABLE 1

| Resistor | Ohms |
|---|---|
| 341 | 200 |
| $R_{IN1}$ | 200 |
| $R_{F1}$ | 3200 |
| $R_{IN2}$ | 200 |
| $R_{F2}$ | 3200 |

Still referring to FIG. 4A, two logical complement amplifier enable signals 76A and 76B are produced by timing circuit 75, rather than of the single amplifier enable signal 76 shown in FIG. 1. The AMP ENABLE signal 76 in the timing diagram of FIG. 2 can represent amplifier enable signal 76A for the embodiment of the invention shown in FIG. 4A. Circuitry 302 in FIG. 4A is a differential channel select circuit, and includes two emitter-coupled PNP transistors 303 and 304, the emitters of which are connected to a current source 305. The collectors of transistors 303 and 304 are connected by resistors 306 and 307, respectively, to the anode of one of diodes 308, the cathode of which is connected to the anode of the other, the cathode of which in turn is connected to $-V_{CC}$.

Selectable differential input stage 351 includes emitter-coupled NPN transistors 310 and 311, the emitters of which are connected to the collector of an NPN selection transistor 312. The emitter of selection transistor 312 is coupled by conductor 317 to a current source 321. The base of selection transistor 312 is connected to the collector of transistor 304. The bases of emitter coupled transistors 303 and 304 of selection circuit 302 are connected, respectively to amplifier enable conductors 76A and 76B.

Selectable differential input stage 352 includes emitter-coupled NPN transistors 323 and 324, the emitters of which are connected to the collector of NPN selection transistor 322. The emitter of selection transistor 322 is connected by conductor 317 to the emitter of selection transistor 312 and to current source 321. The base of selection transistor 322 is connected to the collector of transistor 303.

The base of transistor 310 is connected to DAC output conductor 38 and also is connected by resistor 341 to ground. The input or base of transistor 311 is connected by resistor $R_{IN1}$ to track and hold circuit output conductor 15 and by feedback resistor $R_{F1}$ to output conductor 46.

The input or base of transistor 323 is connected to ground, and the input of transistor 324 is connected by resistor $R_{IN2}$ to ground and by feedback resistor $R_{F2}$ to conductor 46.

The output or load circuitry shared by the two input stages 353 of SWOP amp 350 can be considered to include constant current source 315, which is connected by conductors 313 to the collectors of transistors 310 and 323, respectively. Current source 316 is connected by conductor 314 to the collectors of transistors 311 and 324. Constant current sources 315 and 316 therefore act as high impedance load devices for transistors 310 and 311. Conductor 313 is connected to the emitter of PNP cascode transistor 326, the base of which is connected to a bias voltage conductor $V_B$, which can have a value of +2.5 volts. The collector of transistor 326 is connected by conductor 340 to the base of an NPN emitter follower transistor 30, the emitter of which is connected to conductor 46 and to constant current source 331. Conductor 340 is also coupled by compensator capacitor $C_c$ to ground and is connected to the collector of NPN transistor 332.

Conductor 314 is connected to the emitter of PNP cascode transistor 327, the base of which is connected to $V_B$. The collector of cascode transistor 327 is connected to the base of transistor 332 and the collector of NPN transistor 333. The emitter of transistor 333 is connected by resistor 335 to $-V_{CC}$. The base of transistor 333 is connected to the base of NPN transistor 334, the emitter of which is connected by resistor 336 to −V$_{CC}$. The collector and base of transsstor 334 are connected to the emitter of transistor 332. Transistors 332, 333, and 334 thus form a conventional current mirror the input of which is connected to the collector of transistor 327 and the output of which is connected to conductor 340.

The operation of the circuit can be understood by assuming that the current through constant current source 321 is equal to 3 milliamperes and that the current supplied by each of constant current sources 315 and 316 is 4 milliamperes. Then, if the bases of input transistors 310 and 311 are at identical voltages, 1.5 milliamperes flows through each of transistors 310 and 311, and 2.5 milliamperes flows through conductors 313 and 314 and through the emitters and collectors of cascode transistors 326 and 327 and into the collectors of current mirror transistors 333 and 334, respectively, assuming also that selection transistor 312 is turned on and selection transistor 322 is turned off. Any difference, either positive or negative, between the voltages of conductors 15 and 38 then produces a corresponding imbalance in the amount of current flowing through transistors 310 and 311, and hence in the amount of current flowing into the collectors of transistors 333 and 332. This condition causes a corresponding change in the voltage on conductor 340, and hence on output conductor 46, producing an amplified replica of the voltage difference applied between track and hold conductor 15 and DAC output conductor 38. If the feedback connection is broken, the open loop gain is very high, and amplifier 300 is very accurate as a result of this high open loop gain.

The closed loop gain of the SWOP amp circuit 350 shown in FIG. 4A is equal to $R_{F1}/R_{IN1}$ when differential input stage 351 is selected, and is equal to $R_{F2}/R_{IN2}$ when differential input stage 352 is selected. The open loop gain of this circuit is very high, being equal to the $g_m$ of transistor 310 times the impedance at conductor 340. When differential input stage 351 is selected, the residue or difference between the voltage of track and hold amplifier output conductor 15 and the voltage of digital-to-analog converter output conductor 38 is amplified to produce a corresponding amplified residue signal on output conductor 46.

The circuit operation then is analogous to the condition wherein in FIG. 1 when MOSFET 39 is on and MOSFET 40 is off. When differential input stage 352 is selected, NPN selection transistor 322 is on, selection transistor 312 is off, transistors 310 and 311 are off, and the feedback through $R_{F2}$ holds conductor 46 very close to the ground voltage applied to the base of transistor 323. This keeps the SWOP amp circuit in a "balanced" condition while differential input stage 352 is selected and the output of digital-to-analog converter 36 is undergoing changes during its conversion operation. (Otherwise, the difference between the DAC output 38 and the track and hold output 15 would "overrange" the amplifier.) Then, when differential input stage 351 is selected, all currents are balanced throughout the amplifier, so that the difference voltage applied between conductors 38 and 15 starts off from a balanced condition instead of an overdriven condition and prevents any delay or thermal mismatches that would be caused by the residue amplifier attempting to recover from an overdriven condition. The amplifier of FIG. 4A is very fast, and has the advantage that all worst case conditions can be accommodated without overdriving or saturating any of the transistors. This circuit is easily implemented on a monolithic integrated circuit chip, and avoids the need to utilize discrete MOSFETs 39 and 40, which are used in a hybrid integrated implementation of the invention described in the parent application.

The above-described subranging analog-to-digital converter 1 provides the advantages of avoiding the inaccuracies due to delay circuits that feed the sampled analog signal forward to the subtraction node in the prior art subranging ADCs, and thereby improve the overall accuracy and linearity of the present subranging analog-to-digital converter. The use of the amplifier with multiplexed differential input stages makes possible the described direct feed forward of the sampled analog signal to the subtraction node in a monolithic integrated circuit implementation, and hence the elimination of error due to the feed forward delay elements.

While the invention has been described with reference to a particular embodiment thereof, those skilled in the art will be able to make various changes in the described embodiment of the invention without departing from the true spirit and scope thereof. It is intended that all devices that are equivalent to the described embodiment of the invention in that they contain elements that perform substantially the same function in substantially the same way to achieve substantially the same result are to be considered within the scope of the present invention.

We claim:

1. An X-bit subranging analog-to-digital converter, X being an integer, said subranging analog-to-digital converter comprising in combination:
    (a) means for producing a first analog signal;
    (b) first analog-to-digital converting means for producing a first Y-bit binary word representative of the first analog signal, Y being an integer that is less than X;
    (c) digital-to-analog converting means receiving the first Y-bit binary word for producing a second analog signal, the digital-to-analog converting means having an accuracy of at least X bits, a difference between the first analog signal and the second analog signal being accurately representative of the X-Y least significant bits of an X-bit binary equivalent of the first analog signal;
    (d) means for amplifying the difference by a predetermined factor to produce an amplified difference signal, the amplifying means including
        i. a first selectable differential input circuit, having a first input coupled to receive the first analog signal and a second input coupled to receive the second analog signal,
        ii a second selectable differential input circuit having a third input connected to a reference voltage conductor and a fourth input,
        iii. output circuit means coupled to the first and second selectable differential input circuits for producing the amplified difference signal when the first selectable differential input circuit is selected and for producing an intermediate output signal level when the second selectable differential input circuit is selected, and,
        iv. selecting means responsive to an amplifier enable signal for
            (1) operatively coupling the first selectable differential input circuit to the output circuit means and decoupling the second selectable differential input circuit from the output means in response to a first level of the amplifier input signal, and (2) operatively coupling the second selectable differential input circuit to the output circuit means and decoupling the first selectable differential input circuit from the output circuit means in response to a second level of the amplifier enable signal;

(e) second analog-to-digital converting means for producing a first Z-bit binary word representative of the amplified difference signal, Z being an integer less than X; and (f) means for combining the Y-bit binary word and the Z-bit binary word to produce an X-bit binary word that precisely represents the first analog signal.

2. The X-bit subranging analog-to-digital converter of claim 1 including feedback means for feeding back the amplified difference signal to the first input and to the fourth input.

3. The X-bit subranging analog-to-digital converter of claim 1 wherein the first selectable differential input circuit includes first and second transistors having their emitters coupled together, a third transistor having its collector connected to the emitters of the first and second transistors and its emitter connected to a first current source, and its base connected to the selection means, the base of the first transistor being connected to receive the second analog signal, the base of the second transistor being coupled to receive the first analog signal, the collectors of the first and second transistors being coupled to the amplifying means, and wherein the second selectable differential input circuit includes fourth and fifth transistors having their emitters coupled together and to the collector of a sixth transistor having its emitter connected to the emitter of the third transistor and its base connected to the selecting means, the collectors of the fourth and fifth transistors being connected to the collectors of the first and second transistors, respectively, the base of the fourth transistor being connected to a reference voltage conductor, the base of the fifth transistor being coupled by the fourth input and a first feedback resistor to receive the intermediate output signal level, the base of the second transistor being coupled by the second input and a second feedback resistor to receive the first analog signal.

4. The X-bit subranging analog-to-digital converter of claim 3 wherein the selecting means includes seventh and eighth transistors having their emitters coupled to a second current source, their bases coupled to receive the amplifier enable signal and a logical complement of the amplifier enable signal, respectively, and first and second load devices connected to the collectors of the seventh and eighth transistors, respectively, the collectors of the seventh and eighth transistors being coupled, respectively, to the bases of the third and sixth transistors.

5. The X-bit subranging analog-to-digital converter of claim 4 wherein the output circuit means includes a third current source connected to the collectors of the first and fourth transistors, a fourth current source connected to the collectors of the second and fifth transistors, an emitter follower transistor having its base coupled to the collectors of the first and fourth transistors and its emitter coupled to produce the amplified difference signal, and a current mirror circuit having input conductor coupled to the collectors of the second and fifth transistors and an output conductor coupled to the collectors of the first and fourth transistors.

6. The X-bit subranging analog-to-digital converter of claim 5 including a first resistor connected to couple the first analog signal to the base of the second transistor, the first feedback resistor coupling the base of the second transistor to the emitter of the emitter follower output transistor, a second resistor coupling the base of the fifth transistor to the reference voltage conductor, and the second feedback resistor coupling the base of the fifth transistor to the emitter of the emitter follower output transistor.

* * * * *